United States Patent [19]

Mindel

[11] Patent Number: 4,870,691

[45] Date of Patent: Sep. 26, 1989

[54] LOAD AND DISPERSION CELL FOR SOUND

[76] Inventor: Gerard S. Mindel, 15 Donna Street, Nepean, Ontario, Canada, K2G 2V5

[21] Appl. No.: 37,820

[22] Filed: Apr. 13, 1987

[30] Foreign Application Priority Data

Jan. 14, 1987 [CA] Canada .................................. 527291

[51] Int. Cl.⁴ ................................................ H05K 5/00

[52] U.S. Cl. .................................... 381/159; 381/188; 381/90; 181/144; 181/155

[58] Field of Search .................... 381/88, 90, 188, 205, 381/159; 181/144, 147, 153, 155

[56] References Cited

U.S. PATENT DOCUMENTS

| | | | |
|---|---|---|---|
| 2,646,851 | 7/1953 | Chapman et al. | 181/155 |
| 2,694,463 | 11/1954 | Robbins et al. | 181/155 |
| 2,731,101 | 1/1956 | Klipsch | 381/90 X |
| 2,805,729 | 9/1957 | Read | 181/156 |
| 3,964,571 | 6/1976 | Snell | 181/144 X |
| 4,051,919 | 10/1977 | Buettner | 181/144 |
| 4,268,719 | 5/1981 | Manager | 181/144 X |
| 4,657,107 | 4/1987 | Harwood | 181/144 |

FOREIGN PATENT DOCUMENTS

| | | | |
|---|---|---|---|
| 0758716 | 5/1967 | Canada . | |
| 0757021 | 9/1956 | United Kingdom | 181/144 |
| 0937872 | 9/1963 | United Kingdom | 181/144 |
| 2066619 | 7/1981 | United Kingdom | 381/159 |

*Primary Examiner*—Eugene R. LaRoche
*Assistant Examiner*—Seung Ham
*Attorney, Agent, or Firm*—Burke-Robertson

[57] ABSTRACT

A method and apparatus for sound reproduction wherein a load and dispersion cell is provided. The cell comprises walls to enclose transducer means. The transducer means have front and back surfaces and are secured within the walls. The walls form an elongated narrow sound emitting slot. The slot is spaced from and extends parallel to and over the lengthwise center of the front surface of the transducer means. The slotted cell spreads the field of sound generated by the transducer in a direction perpendicular to the longitudinal axis of the slot and loads the transducer to lower its resonance. The cell in accordance with the present invention extends the low frequency response and provides more uniform dispersion of sound.

13 Claims, 2 Drawing Sheets

LOAD AND DISPERSION CELL FOR SOUND

BACKGROUND OF THE INVENTION

The present invention relates to a method and apparatus for sound reproduction, and more particularly to a load and dispersion cell that provides for more uniform frequency dispersion when used in combination with a variety of transducer types.

Known technology for sound reproducers depends heavily on dynamic speaker cones in sealed and ported cabinets, and on bipolar radiators when large, light diaphragm surfaces are involved. In the following specification, when the word "transducer" or "transducer means" is used, it is intended to refer generally to transducers, diaphragms, cones, piston arrays and the like used for sound reproduction.

Conventional loudspeaker designs are often based on a high-pass filter model. In such designs dynamic loudspeaker enclosure combinations of sealed or vented design are provided in which the mass of the transducer essentially provides one of the system masses and is only secondarily influenced by an air mass in contact with the diaphragm on both sides. If venting or tuning is used with an enclosure it is accomplished by way of an opening separate from that into which the transducer is placed. The venting can take the form of a tuning duct, a mass attached to a second passive diaphragm, a highly lossy opening, an acoustic transmission line, etcetera.

There exists a family of transducers with diaphragms of negligible mass, large active area and small peak displacement. They are generally regarded as being unsuitable for mounting in cabinets of the above types, as this would raise the low frequency cut-off of the system to an unsatisfactorily high frequency for a cabinet of reasonable size. This has led to the use of light and large diaphragm transducers as bipolar assemblies (without enclosure) primarily to preserve maximum use of the low frequency response. Bipolar systems, however, usually suffer from cancellation at low frequencies between the front and rear radiation of the transducer.

The light, large diaphragm has inherent advantages. Because of the low mass and simple structure, it can respond to low as well as very high audio frequencies cleanly and smoothly. Since a dynamic/cone type transducer of equal area has a heavier diaphragm and cannot normally reproduce high frequencies, a smaller and lighter cone must be utilized to take over from the larger cone.

The inherent wide-band performance-capability and time alignment makes light, large diaphragm transducers attractive. As well, such transducers provide an absence of cross-over frequency phase-aberration and no need for time alignment between drivers. Large diaphragms of any transducer type, however even if they can reproduce the necessary wide frequency range suffer from high frequency beaming.

As frequencies get higher and higher, the dispersion of frequencies becomes narrower and narrower until at high frequencies, only a narrow beam of high intensity remains. This makes for unsatisfactory dispersion when used for monophonic as well as stereophonic reproduction. One approach to overcome this is to make the transducer dimensions smaller in the direction in which dispersion is required. Another is to use an acoustic lens. But making the transducer smaller sacrifices low frequency sound level capability while using an acoustic lens adds cost. Alternatively, attempts have been made to use many transducers positioned along a curve (or on a sphere). The circular radiating field created by this approach leaves gaps and phase-aberrations at the beam intersections. Good performance is difficult to achieve, and takes up a lot of space.

Another approach has been to use a flat transducer panel with segmented drive from delay line taps to simulate a point source lying some distance behind the transducer assembly. This is a relatively complicated solution and requires expensive, sophisticated equipment. Another approach is to use transducers of different widths for different frequencies. This sacrifices the elegance of the wide bandwidth capability of the light transducer panel system and introduces the cost and problems of cross-over networks and tends to increase the size of the structure.

Normally line sources with open transducers/diaphragms/cones or flat panels do not give sufficient high frequency dispersion unless the transducers are about one wave length or less wide at the highest frequency of concern. A reduction in transducer width to accommodate high frequency dispersion however leads to reduced capability to reproduce low frequencies since normally transducer active area and displacement must be sacrificed.

Mr. G. A. Briggs, in a paper entitled "All About Audio and High-Fi—The Listening Ear", published in "Hi-Fi Annual and Audio Handbook" - 1959 Edition, at pages 26 and 27, describes and illustrates the use of a Kolster-Brandes Ltd. slot diffuser consisting of a slotted board a bit larger than a speaker cone, which is placed in front of a large sized dynamic speaker with the slot along the vertical diameter. The slot widens the dispersion of the high frequency energy, emanating only from the central area of the large cone, horizontally to a fan shape. (The sound energy would otherwise be concentrated in a narrow pencil beam). The board as described is spaced from the speaker cabinet leaving an air gap through which low frequency sound energy can escape and thereby minimize the effect of the slotted board on the low frequency performance of the driver.

Another reference of general background interest is Nakanishi U.S. Pat. No. 4,280,585 issued July 28, 1981 in which an array of speaker units are vertically mounted in a cabinet with a plurality of reflecting boards and sound pressure guide boards so that sound from the speaker units is passed to openings in the front of the enclosure.

It is an object of the present invention to provide a load and dispersion cell and method which will permit usage of transducers of larger width while at the same time providing improved dispersion of sound at higher frequencies without sacrificing low frequency capability and allowing it even to be extended. It is another object of the present invention to provide an economical and simple cabinet construction incorporating the load and dispersion cell which will provide such features when used in conjunction with such transducers.

SUMMARY OF THE INVENTION

According to the present invention there is provided a load and dispersion cell for sound reproduction. The cell comprises walls enclosing transducer means. The transducer means have front and back surfaces and are secured within the walls. The walls form an elongated narrow sound emitting slot. The slot is spaced from and extends parallel to and over the lengthwise center of the front surface of the transducer means and is narrower than the surface. The slot loads the transducer to spread the field of sound generated by the transducer in a direction perpendicular to the longitudinal axis of the slot and also preferably loads the transducer to lower the cell resonance below the open air resonance of the transducer on its own.

In a preferred embodiment of the present invention the walls of the cell in front of the transducer means are angled with respect to each other to produce an air column in front of the transducer means of substantially triangular cross-section that terminates in the narrow slot.

In another preferred embodiment of the present invention, the walls may also form a narrow sound emitting slot spaced from and extending parallel to and over the lengthwise center of the back surface of the transducer means. The slot spreads the field of sound generated by the transducer in a direction perpendicular to the longitudinal axis of the slot and loads the transducer to lower the transducer/cell resonance still further.

As well a method is provided for sound reproduction using a load and dispersion cell. The cell has walls enclosing transducer means. The transducer means have front and back surfaces and are secured within the cabinet walls. The method comprises coupling the front surface of the transducer means to an air column of roughly triangular cross-section that terminates in a narrow elongated slot in the walls. The slot is spaced from and runs parallel to and over the lengthwise center of the transducer means to provide spreading the field of sound generated by the transducer in a direction perpendicular to the longitudinal axis of the slot and loads the transducer to lower the transducer/cell resonance.

The apparatus and method according to the present invention, when applied to a speaker system, result in improved uniformity and dispersion of sound in a direction perpendicular to the longitudinal axis of the slot, over the whole audible range of frequencies of wave lengths greater than the width of the slot. Within the height of the transducer slot there is minimum beaming of direct sound. This, therfore, gives a very uniform field in front of the slot in directions perpendicular to the longitudinal axis of the slot. In the direction of the slot sound energy is only being radiated at low frequencies where wave length becomes comparable to or greater than the slot length. The present invention allows a better compromise between otherwise conflicting factors dictating a narrow transducer diaphragm at high frequencies for adequate dispersion and a wide diaphragm for low frequency reproduction. Acoustic output is limited at the low frequency end only by the excursion capability of the transducer and to a lesser degree by the transducer's low frequency resonance, and at the upper frequency end by the high frequency capability of the transducer and summing in the slot area of the sound pressure contributions from different parts of the diaphragm/cone/piston array. The invention permits the creation of a load cell that on one hand allows a wider transducer diaphragm surface than could otherwise be used to achieve the desired high frequency dispersion and, on the other hand, lowers the natural open air resonance of the diaphragm by loading the diaphragm. In this way, the suitability of a transducer is extended in both the high frequency as well as in the low frequency directions.

BRIEF DESCRIPTION OF THE DRAWINGS

These and other objects and advantages of the invention will become apparent upon reading the following detailed description and upon referring to the drawings in which.

Figure 1:
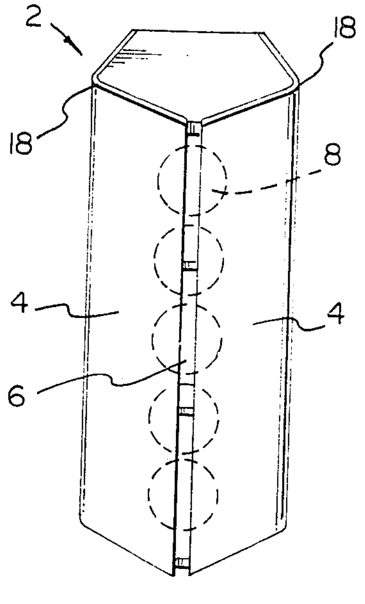
FIG. 1 is a perspective view, from the front, of a speaker cabinet incorporating a load and dispersion cell in accordance with the present invention.

While the invention will be described in conjunction with example embodiments, it will be understood that it is not intended to limit the invention to such embodiments. On the contrary, it is intended to cover all alternatives, modifications and equivalents as may be included within the spirit and scope of the invention as defined by the appended claims.

DETAILED DESCRIPTION OF THE INVENTION

In the drawings similar features have been given similar reference numerals.

Figure 2:
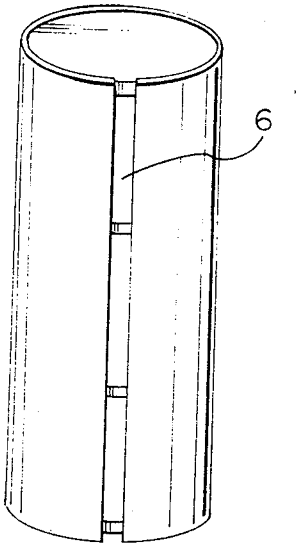
FIG. 2 is a perspective view, from the front, of an alternative embodiment of such a speaker cabinet.

Turning to FIG. 1 there is illustrated a speaker cabinet 2 incorporating a load and dispersion cell in accordance with the present invention, the speaker cabinet being of prism shape, in which the front walls 4 are forwardly angled and terminate at a vertical slot 6, behind which slot is spaced a vertical array of transducers 8 (phantom). The cabinet material may be, inter alia, made of wood, metal, plastic, composites or concrete. The transducer array has a length greater than its width with the slot 6 extending parallel to and over the lengthwise center of the front of the array of transducers 8. Slot 6, as can be seen, is narrower than the surface of transducer 8 over which it sits. The width of slot 6 is predetermined based on, for example, the frequency characteristics of the transducers and the dispersion requirements for the speaker cabinet at different frequency ranges. This width should preferably be no greater than the wave length of the highest audible sound in respect of which proper dispersion is required. While the slot is illustrated as being of uniform width over its length, that width may be varied over its length to achieve desired frequency characteristics and dispersion requirements. The transducer array can be of any type previously referred to herein such as diaphragm, cone, piston array and the like including combinations thereof. They may be of electrostatic, planar (including flat or curved diaphragm surfaces) magnetic, dynamic cone, piezo electric, ribbon driver, electrostrictive or magnetostrictive type, or of any other appropriate type. In FIG. 2 a similar cabinet structure is illustrated in which the cabinet is of cylindrical instead of prismatic shape. Cabinet 2 may have only slot 6 as their porting means for emission of sound from the cabinet, or may alternatively be provided with any other appropriate porting or venting means to assist in sound transmission from the speaker cabinet in conjunction with slot 6.

Figure 3A:
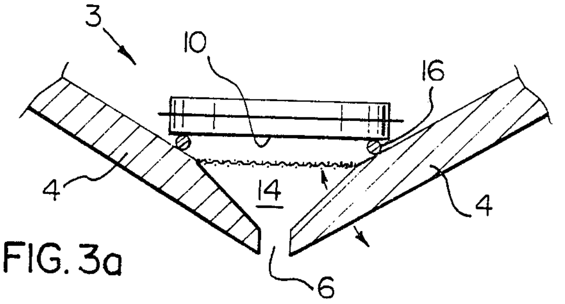
FIGS. 3*a* and 3*b* are partial, horizontal section views of alternative example embodiments of load and dispersion cell structures in accordance with the present invention.
Figure 3B:
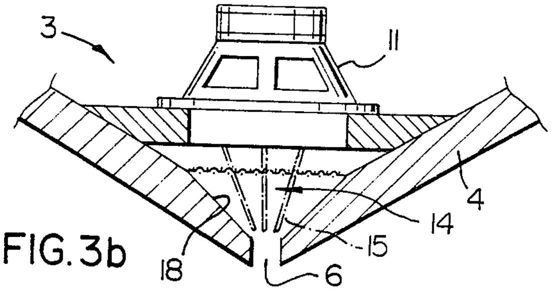

As can be seen in FIGS. 3*a* and 3*b*, front walls 4 of the load and dispersion cell 3 are secured to the side of front surface 10 of transducer 8. There must be a tight seal between transducer 8 and these walls for proper operation of the device. The front walls 4 are angled with respect to each other, to produce an air column 14 in front of transducers 8 of substantially triangular cross-section, which column terminates in slot 6. In FIG. 3*a*, walls 4 are fixed or may be movable, for example by pivoting at points 16 so that the angle which the walls make with respect to each other may be varied or the width of the slot 6 varied. Transducers 8 are illustrated as being planar in FIG. 3*a* and cone speakers in FIG. 3*b*. The outer corners 18 of walls 4 are somewhat rounded, as indicated. This improves the sound dispersion characteristics and avoids secondary refraction edges for sound travelling close to the surface of wall 4. Also as shown in phantom, in FIG. 3*b*, the triangular section can be sub-divided by closely spaced baffles 15 into smaller triangular sections running the length of the slot and transducer, with each triangular section starting on the surface of the transducer and ending at the slot. This can be visualized as longitudinal baffle plates/separators. This provides damping to the air making up column 14. This embodiment can be used as an additional or alternative damping means to the screen shown in the Figures.

Figure 4A:
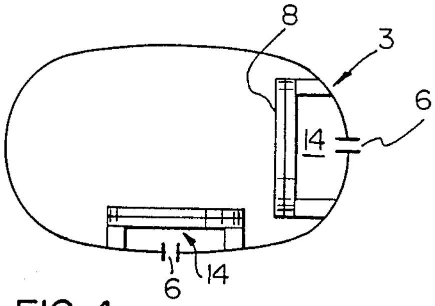
FIGS. 4*a*, 4*b*, 4*c*, and 4*d* are schematic horizontal section views of alternative example embodiments of load and dispersion cell structures in accordance with the present invention.
Figure 4B:
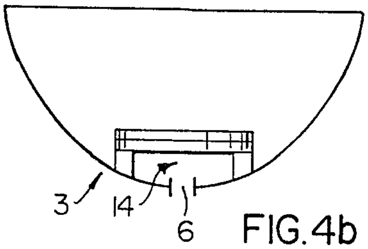
Figure 4C:
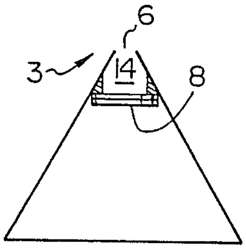
Figure 4D:
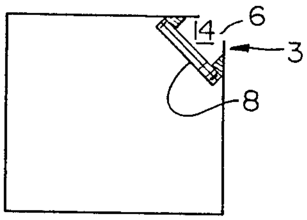

Alternative constructions of cells in accordance with the present invention are illustrated in FIGS. 4*a* (elliptical walls), 4*b* (circular) parabolic or hyperbolic section walls), 4*c* (triangular walls) and 4*d* (square, rectangular, rhombic or quadrilateral walls). It will be seen that the air column 14 in some of these alternative embodiments is not as triangular in cross-sectional appearance as in others.

Figure 5:
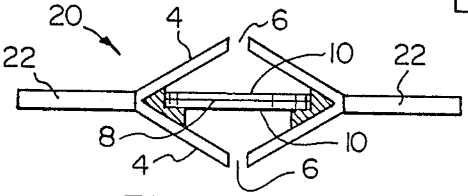
FIGS. 5 and 6 are schematic section views of yet further embodiments of speaker cabinets incorporating cells in accordance with the present invention using both front and rear loading of diaphragms.
Figure 6:
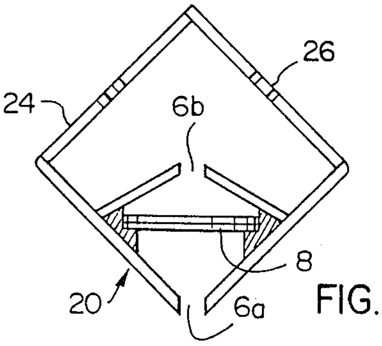

In the alternative embodiment illustrated in FIG. 5, there is schematically illustrated in horizontal section, a double-sided cell 20 in a bipolar application. High frequency and medium frequency transducers 8 using curved or planar transducer or dynamic drivers (extended to low frequencies if needed) are circumscribed by cabinet walls 4, providing front surfaces 10 facing in opposite directions, with slots 6 spaced therefrom to radiate sound in opposite directions as illustrated. Dummy or subwoofer panels 22 on the two sides of the structure reduce low frequency cancellation or augment low frequency capability respectively. In FIG. 6 a cabinet 24 is illustrated using such a double-sided cell 20. Slot 6*a* serves as a loading, and radiating slot for the transducer 8, and slot 6*b* serves as a loading slot. Sound emitted from loading slot 6*b* inside cabinet 6*b* can escape from appropriate port means or vents 26 in appropriate cabinet walls 4, if desired.

The present invention allows the use of for example a four inch wide diaphragm/cone radiating all frequencies uniformly from its surface to cover the frequency range of from about 100 Hz to beyond audibility with dispersion exceeding 180° in the plane perpendicular to the slot. With additional venting/tuning of the cabinet, low frequency cut-off may be lowered to say 30 Hz. A vertical array of such drivers can therefore produce an excellent whole range speaker system with ample low frequency capability.

For the cabinet structure in accordance with the invention, the slot 6 and air volume 14 enclosed behind it, in front of transducer 8 and the corresponding cabinet walls, both loads the transducer and acts as a uniform frequency disperser. This method of coupling can be applied to various realizations of transducers/arrays with large surfaces and with relatively large ratio between radiating surface width and length (much narrower than long) and with the width aligned parallel to the slot (as for example in FIGS. 1 and 2). Augmented forms are possible in which the cabinet is ported, thereby by radiating both through the slot loaded cabinet opening as well as at low frequencies through the cabinet porting structure.

The apparatus and method in accordance with the present invention combines the possibility for maintaining low system resonance frequency with increased dispersion of high frequencies. It also allows for relatively small cabinet sizes. In doing this the invention limits dispersion to a cylindrical field roughly equivalent to the length of the diaphragm in the vertical direction but while providing better than 180° degree sound dispersion in the horizontal plane. In this way it is also possible to exploit tuning of system resonance below the natural open air resonance of the transducer/array on its own, and to use the system effectively to a lower frequency than otherwise possible.

The limiting factor for reasonably flat high frequency response by way of the slot is that the incremental contribution of small sections of the diaphragm to either side of the slot sum satisfactorily over the frequency range to give the desired frequency response flatness and that resonances within the space between slot and transducer are damped. Some widening of the diaphragm or a still smoother frequency response can be obtained at somewhat greater cost by applying compensating delays to portions of the transducer, which can be achieved if the drive is segmented into separate strip-like sections running parallel to the slot. In this way a cylindrical sound field can be simulated conveniently for electrostatic, magnetic ribbon drivers, etcetera. The transducer diaphragm/cone/piston can itself be curved to produce a curved wave front with the necessary matched delays. This approach can be used with any transducer capable of accepting or producing in its direct vicinity a flat or curved (concave rather than convex) acoustic pressure field. By concave is meant that the wave front emerging from the diaphragm is delayed in such a way that the wave front is bellied inwardly (concave) at the center towards the transducer and upon arrival at the slot the sound output of all increments combine satisfactorily.

The slot width in accordance with the present invention is selected to approach or be smaller than the highest wave length of interest.

Within the confines of the length of the radiating slot 6, the sound field varies roughly inversely with the distance rather than inversely with the square of the distance as for a point source. This has major favourable and practical implications for stereo reproduction:

(a) This approach provides a larger stereophonic listening area as compared to two point sources, in the plane perpendicular to the slot axis.

(b) The sound source can be made to appear in front of the listener whether standing or seated, if the slot is made long enough.

(c) The field of uniform frequency dispersions is very wide and deep, ranging from directly to the side and even somewhat behind a reproducer, to directly in front. This makes it possible to freely move about while listening to sound reproduced without the problem of spotty frequency coverage. The dispersion is further aided by the direct with-distance decrease in amplitude, which is made even more uniform in a reverberant environment.

(d) There is little or no beaming of direct sound nor of reflections from objects and boundaries. This gives a very uniform reverberant field in the horizontal plane.

(e) Since the total frequency spectrum radiates horizontally from effectively a single vertical line, the slot width, moving about the speaker slot, does not produce a variable differential time delay between parts of the frequency spectrum. Therefore the source stays coherent (or time aligned) at all frequencies and independent of listener position in relation to it. This means excellent frequency-independent spacial presentation (localization) for well recorded stereophonic programs.

(f) In pairs for stereo and in applications of three or more units for surround sound, the effect of all sound energy coming from the narrow slot area provides excellent sound localization and panoramic and depth presentation.

The present invention provides major advantages over other designs having several sizes of differently wide radiators. It also provides major advantages over radiator structures that have several horizontally displaced point sources or line source radiator structures carrying different frequency bands.

Figure 7:
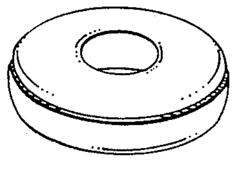
FIG. 7 is a perspective view of a further alternative embodiment of speaker cabinet.

Thus, there has been provided in accordance with the present invention a load and dispersion cell structure that fully satisfies the objects, aims and advantages set forth above. While the invention has been described in conjunction with specific embodiments thereof, it is evident that many alternatives, modifications and variations will be apparent to those skilled in the art in light of the foregoing description. For example, a single double slotted cabinet or two separate slotted cabinet systems with transducers therein can be placed parallel to each other in each channel to create a stereophonic system with inter-aural cancellation. As well, a spherical-shaped cabinet with the slot on its surface, or a donut-shaped cell or cabinet, with the slot extending in circular fashion about the outer wall (FIG. 7), the inner wall or side (upper or lower) wall may be provided in accordance with the present invention. Alternatively, to increase dispersion in the vertical direction (see FIGS. 1 and 2) the walls and transducer/array can be curved in the plane containing the slot and perpendicular to the transducer/array diaphragm/cone/piston surface, creating a convex (ie. outward bellied) slot. As an example of an alternative to curving the cabinet and transducer/array, progressively more electronic delay can be applied towards the extremities of the transducer length, thus creating a convex wave front (bellied outward at the center ie. toward the slot). A further alternative is to segment the transducer/array to approximate a curve or to step sections of the transducer array progressively further away from the slot. Yet another alternative embodiment of the present application is to integrate the load and dispersion cell with other building structures such as columns, walls, ceilings, etcetera. In such a case the cell opening can be flush with the surface of the structure. This embodiment allows the cell to be almost hidden from sight. Accordingly, it is intended to embrace all such alternatives, modifications and variations as fall within the spirit and broad scope of the invention.

What I claim as my invention:

1. A load and dispersion cell for wide angle uniformity and dispersion of sound over the audio range, comprising walls enclosing transducer means, the transducer means having front and back surfaces and being secured within the walls, the walls forming an elongated narrow sound emitting slot spaced from and extending parallel to and over the lengthwise center of the front surface of the transducer means, the slot being narrower than the transducer front surface, the slot to load the transducer means and to spread the field of sound generated by the transducer means in a direction perpendicular to the longitudinal axis of the slot the walls on either side of the front surface of the transducer means being angled with respect to each other to produce an air column in front of the transducer means of substantially triangular cross-section.

2. A cell according to claim 1 wherein a tight seal is provided between the walls of the cell and the adjacent sides of the front surface of the transducer means.

3. A cell according to claim 1 wherein the walls also form a narrow sound emitting slot spaced from and extending parallel to and over the lengthwise center of the back surface of the transducer means, this slot being narrower than this back surface to spread the field of sound generated by the transducer means in a direction perpendicular to the longitudinal axis of the slot and to load the transducer means to lower the resonance of the cell below the open air resonance of the transducer means on its own.

4. A load dispersion cell according to claim 1 wherein the transducer means is selected from the group consisting of electrostatic transducers, planar magnetic transducers, dynamic cone transducers, piezo electric ribbon drivers, electrostrictive transducers, magnetostrictive transducers and combinations thereof.

5. A cell according to claim 1 wherein the walls beside the transducer means are pivotably secured to the transducer means to permit adjustment of the width of the slot and of the angle between the walls in front of the transducer means.

6. A cell according to claim 1 incorporated in a speaker cabinet, the cell walls constituting the exterior walls of the speaker cabinet.

7. A cell according to claim 6 wherein the speaker cabinet walls enclose the back of the transducer means in sealed fashion.

8. A cell according to claim 6 wherein the speaker cabinet walls enclose the back of the transducer means in vented fashion.

9. A cell according to claim 3 having panels extending outwardly from the walls on either side of the transducer means.

10. A method of sound producing using a load and dispersion cell having walls enclosing transducer means with the transducer means having front and back surfaces and secured within speaker cabinet walls, the method comprising coupling the front surface of the transducer means to an air column of substantially triangular cross-section formed by the walls and the front surface of the transducer means, the walls forming a narrow elongated slot, the slot spaced from and running parallel to and over the lengthwise center of the transducer means to spread the field of sound generated by the transducer in a direction perpendicular to the longitudinal axis of the slot.

11. A method according to claim 10 wherein the back surface of the transducer means is enclosed by the walls in a sealed or vented enclosure.

12. A method according to claim 10 wherein the rear surface of the transducer means is also coupled to another air column of substantially triangular cross-section formed by the walls and the front surface of the transducer means, the walls forming a narrow elongated slot, this slot spaced from and running parallel to and over the lengthwise center of the transducer means to spread the field of sound generated by the transducer means in a direction perpendicular to the longitudinal axis of the slot and to load the transducer to lower the resonance of the cell below the open air resonance of the transducer means on its own.

13. A method according to claim 10 wherein the transducer means comprises a linear array of individual transducers of identical or different types.

* * * * *